(12) United States Patent
Kawai et al.

(10) Patent No.: US 11,424,290 B2
(45) Date of Patent: Aug. 23, 2022

(54) VARIABLE RESISTANCE ELEMENT

(71) Applicant: KIOXIA CORPORATION, Tokyo (JP)

(72) Inventors: Hiroki Kawai, Inazawa Aichi (JP); Daisuke Watanabe, Yokkaichi Mie (JP); Toshihiko Nagase, Saitama Saitama (JP)

(73) Assignee: KIOXIA CORPORATION, Tokyo (JP)

( * ) Notice: Subject to any disclaimer, the term of this patent is extended or adjusted under 35 U.S.C. 154(b) by 45 days.

(21) Appl. No.: 16/803,933

(22) Filed: Feb. 27, 2020

(65) Prior Publication Data
US 2021/0083007 A1   Mar. 18, 2021

(30) Foreign Application Priority Data

Sep. 18, 2019  (JP) .............................. JP2019-169872

(51) Int. Cl.
*H01L 45/00*  (2006.01)
*H01L 27/24*  (2006.01)
*H01L 27/22*  (2006.01)

(52) U.S. Cl.
CPC ........ *H01L 27/2427* (2013.01); *H01L 27/224* (2013.01); *H01L 45/144* (2013.01)

(58) Field of Classification Search
CPC ... H01L 45/144; H01L 45/04; H01L 27/2427; H01L 27/224
See application file for complete search history.

(56) References Cited

U.S. PATENT DOCUMENTS

| | | | |
|---|---|---|---|
| 8,921,821 B2 | 12/2014 | Yasuda et al. | |
| 10,084,017 B2 | 9/2018 | Ohba et al. | |
| 11,024,372 B2 * | 6/2021 | Boniardi | G11C 13/0004 |
| 2009/0250682 A1 * | 10/2009 | Park | H01L 45/1233 |
| | | | 257/4 |
| 2012/0008370 A1 * | 1/2012 | Yasuda | H01L 45/144 |
| | | | 365/148 |

(Continued)

FOREIGN PATENT DOCUMENTS

| | | | | |
|---|---|---|---|---|
| JP | 3431386 B2 * | 7/2003 | | G03G 5/02 |
| JP | 5434967 B2 | 3/2014 | | |

(Continued)

OTHER PUBLICATIONS

X. E. Bekheet "Electrical and optical properties of amorphous $Ga_2Te_3$ films", The European physical Journal Applied Physics 16, 187 (2001).

(Continued)

*Primary Examiner* — Bitew A Dinke
(74) *Attorney, Agent, or Firm* — Kim & Stewart LLP

(57) ABSTRACT

According to one embodiment, a variable resistance element includes a first electrode, a second electrode, and a variable resistance layer and a tellurium-containing compound layer disposed between the first electrode and the second electrode. The tellurium-containing compound layer contains tellurium, oxygen, and at least one element selected from tin, copper, and bismuth. In some examples, the tellurium-containing compound layer can function as a switching layer in a memory cell structure.

14 Claims, 2 Drawing Sheets

(56) References Cited

U.S. PATENT DOCUMENTS

| | | | | |
|---|---|---|---|---|
| 2012/0145987 | A1* | 6/2012 | Sei | H01L 45/1625 257/5 |
| 2013/0044532 | A1* | 2/2013 | Bethune | G11C 13/003 365/148 |
| 2013/0256622 | A1* | 10/2013 | Sei | H01L 45/145 257/4 |
| 2016/0336378 | A1* | 11/2016 | Oh | G11C 13/0007 |
| 2017/0170237 | A1* | 6/2017 | Jung | H01L 27/2427 |
| 2017/0244030 | A1* | 8/2017 | Park | H01L 45/144 |
| 2018/0019391 | A1* | 1/2018 | Oh | H01L 27/105 |
| 2018/0047784 | A1* | 2/2018 | Oh | H01L 27/105 |
| 2018/0175109 | A1* | 6/2018 | Choi | G11C 13/0004 |
| 2018/0277601 | A1 | 9/2018 | Ahn et al. | |
| 2018/0358557 | A1 | 12/2018 | Jung | |
| 2019/0181336 | A1* | 6/2019 | Lee | H01L 45/1233 |
| 2019/0252605 | A1* | 8/2019 | Redaelli | H01L 45/122 |
| 2019/0252609 | A1 | 8/2019 | Sei et al. | |
| 2019/0296083 | A1 | 9/2019 | Ikarashi et al. | |
| 2020/0286954 | A1* | 9/2020 | Usami | H01L 45/1233 |
| 2020/0327935 | A1* | 10/2020 | Kim | G11C 13/003 |

FOREIGN PATENT DOCUMENTS

| | | |
|---|---|---|
| WO | 2017217119 A1 | 12/2017 |
| WO | 2018203459 A1 | 11/2018 |
| WO | 2018066320 A1 | 8/2019 |

OTHER PUBLICATIONS

Hao Zhu et al. "$Ga_2Te_3$ phase change material for low-power phase change memory application", Applied physics Letters 97, 083504(2010).

Ting-Hao Chang et al. "Bandgap-Engineered in Indium-Gallium-Oxide Ultraviolet Phototransistors", IEEE Photonics Technology Letters 27, 915 (2015).

S Palaz et al."Topological Insulators: Electronic Band Structure and Spectroscopy", IOP Conf. Series: Materials Science and Engineering 175, 012004(2017).

V.Srikant and D.R.Clarke "On the optical band gap of zinc oxide", Journal of Applied Physics 83, 5447(1998).

Kenji Nomura et al."Amorphous Oxide Semiconductors of High-Performance Flexible Thin-Film Transistor" Jpn.J.Appl.Phys. 45, 4303 (2006).

Shunji Ozaki et al. "Optical Constants Amorphous $Ga_2Te_3$ and $In_2Te_3$", Jpn.J.Appl.Phys. 33, 6213 (1994).

Tadatsugu Minami, "Transparent and conductive multicomponent oxide films prepared by magnetron sputtering", Journal of Vacuum Science & Technology A 17, 1765 (1999).

Yagi Zhang et al. "Glass formation in narrow band-gap SnTe-based chalcogenide systems", Materials Letters 194, 149 (2017).

Ying He et al."High thermoelectric performance in copper telluride", NPG Asia Materials 7, e210 (2015).

S.Adachi "D6 Zinc Telluride(ZnTe)", Optical Constants of Crystalline and Amorphous Semiconductors 473 (1999).

H. H. Tippins "Optical Absorption and Photoconductivity in the Band Edge of $\beta$-$Ga_2O_3$", Physical Review 140, A316 (1965).

J. A. Berger et al. "ab initio calculation of electronic excitations: Collapsing spectral sums", Physical Review B 82,041103(R) (2010).

Daniele Lelmini "Threshold switching mechanism by high-field energy gain in the hopping transport of chalcogenide glasses", Physical Review B 78, 035308 (2008).

A.V.Kolobov et al. "Local structure of the crystalline and amorphous states of $Ga_2Te_3$ phase-change alloy without resonant bonding: A combined-ray absorption and ab initio study", Physical Review B 95, 054114 (2017).

D.Dragoni et al. "First-principles study of the liquid and amorphous phases of $In_2Te_3$", Physical Review Materials 1, 035603 (2017).

Leonard Kleinman et al. "Self-consistent energy bands of $Cu_2O$", Physical Review B 21, 1549 (1973).

Kurt E. Peterson et al. "Properties of Crystalline and Amorphous Silicon Telluride", Physical Review B 8, 1453 (1973).

G. Wang et al. "Electronic structure of the thermoelectric materials $Bi_2Te_3$ and $Sb_2Te_3$ from first-principles calculations", Physical Review B 76,075201(2007).

Z.A.Weinberg et al."Transmission, photoconductivity, and the experimental band gap of thermally grown $SiO_2$films", Physical Review B 19, 3107 (1979).

A. Walsh et al. "Nature of the Band Gap of $In_2O_3$ Revealed by First-Principles Calculations and X-Ray Spectroscopy", Physical Review Letters 100, 167402 (2008).

H. Lu et al. "Impact of annealing on morphology and thermal stability of $Bi_2O_3$ nanotube-based microarchitectures" Phys. Status Solidi A 209, 2157-2160(2012).

Y. Koo and H. Hwang "$Zn_{1-x}Te_x$ Ovonic Threshold Switching Device Performance and its Correlation to Material Parameters", Scientific Reports 8, 1822 (2018).

M. A. Afifi, et al. "The switching phenomenon in amorphous $In_2Te_3$ thin films", 47, 265 (1996).

* cited by examiner

VARIABLE RESISTANCE ELEMENT

CROSS-REFERENCE TO RELATED APPLICATION(S)

This application is based upon and claims the benefit of priority from Japanese Patent Application No. 2019-169872, filed Sep. 18, 2019, the entire contents of which are incorporated herein by reference.

FIELD

Embodiments described herein relate generally to a variable resistance element.

BACKGROUND

A variable resistance element including a switching layer and a variable resistance layer utilized as a non-volatile memory layer has been used in a storage device. There has been a demand to improve the cycle characteristics and enhance the durability of such a variable resistance element.

DETAILED DESCRIPTION

Figure 1:
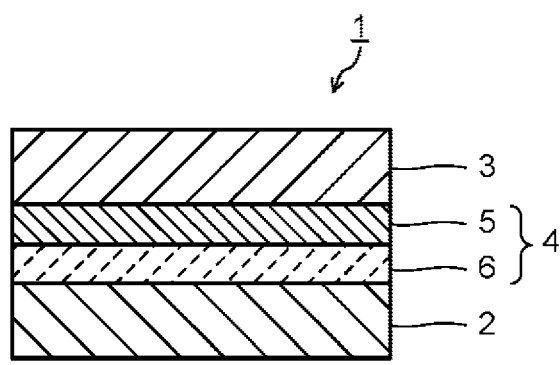
FIG. 1 is a schematic cross-sectional view of a variable resistance element according to an embodiment.

Certain embodiments provide a variable resistance element having enhanced durability.

In general, according to one embodiment, a variable resistance element includes a first electrode, a second electrode, and, disposed between the first and second electrodes, a variable resistance layer and a tellurium-containing compound layer. The tellurium-containing compound layer contains tellurium, oxygen, and at least one element selected from tin, copper, and bismuth. In some examples, the tellurium-containing compound layer functions as a switching layer or element in a variable resistance type memory cell structure or device.

Example embodiments of the present disclosure will now be descried with reference to the drawings. In the drawings and in the following description, the same symbols are used for components or elements having substantially the same construction, and a description thereof will sometimes be omitted. It should be noted that the drawings are, in general, schematic. Thus, any depicted relationship between a thickness and planar dimensions of a component or element, a thickness ratio between components or elements, or the like may not correspond to those in an actual implementation.

Figure 2:
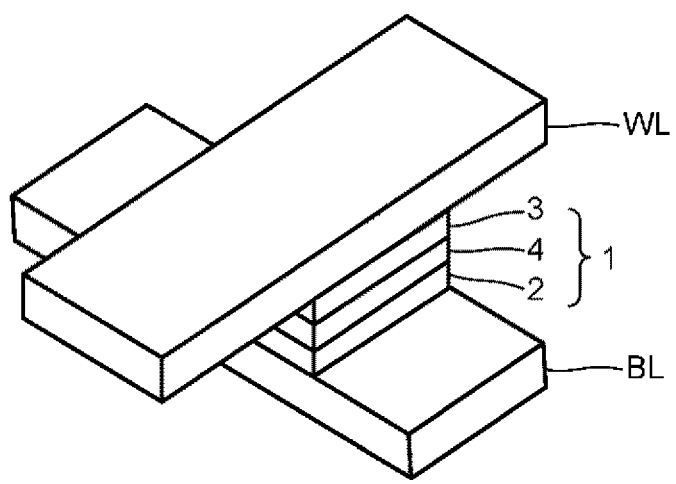
FIG. 2 is a schematic perspective view of a variable resistance element according to an embodiment.

FIG. 1 is a cross-sectional view showing the basic construction of a variable resistance element 1 according to an embodiment. FIG. 2 is a perspective view showing the basic construction of the variable resistance element 1 according to the embodiment. The variable resistance element 1 shown in FIGS. 1 and 2 includes a first electrode 2, a second electrode 3, and a laminate film 4 disposed between the first electrode 2 and the second electrode 3. The laminate film 4 includes a variable resistance layer 5, which functions as a non-volatile memory layer, and a tellurium-containing compound layer 6, which functions as a switching layer. As shown in FIG. 2, the variable resistance element 1 is disposed at an intersection between a bit line BL and a word line WL, and functions as a memory cell. Though only one intersection between a bit line BL and a word line WL is shown in FIG. 2, in actuality variable resistance elements 1 are disposed at a large number of intersections between numerous bit lines BL and word lines WL in an actual semiconductor storage device.

A memory layer for use in a conventionally-known variable resistance memory can be used as the variable resistance layer 5. Known variable resistance memories include a resistive random access memory (ReRAM), a phase change memory (PCM), a magnetoresistive random access memory (MRAM), etc. Any memory layer, which is known to be usable in such a variable resistance memory, can be used as the variable resistance layer 5 of the present embodiment. The variable resistance layer 5 is not limited to a single-layer structure; thus, it may be that the variable resistance layer is a film comprising multiple layers (also referred to as a film stack or a layer stack, in some contexts) that are used to provide the functions of a memory cell. Metal electrodes of, for example, Cu, a Cu alloy, Al or an Al alloy can be used as the first and second electrodes 2, 3.

The tellurium-containing compound layer 6, which functions as a switching layer (also referred to as a switching element in some instances), is connected directly to the variable resistance layer 5, and functions to switch on/off an electric current to the variable resistance layer 5. The tellurium-containing compound layer 6 has the electrical property of rapidly changing from a high-resistance "off" state to a low-resistance "on" state when a voltage higher than a threshold (Vth) is applied. Thus, when the voltage applied to the tellurium-containing compound layer 6 is lower than the threshold (Vth), the tellurium-containing compound layer 6 functions as an insulator and prevents electric current from flowing to the variable resistance layer 5, thereby bringing the variable resistance layer 5 into an off state. When the voltage applied to the tellurium-containing compound layer 6 exceeds the threshold (Vth), the resistance of the tellurium-containing compound layer 6 rapidly decreases, and the tellurium-containing compound layer 6 comes to function as an electrical conductor. Thus, the tellurium-containing compound layer 6 allows passage therethrough of electric current to the variable resistance layer 5, thereby bringing the variable resistance layer 5 into an on state. Such a change in the resistance state of the tellurium-containing compound layer 6 is based on the applied voltage and occurs reversibly and rapidly.

The above-described function of the tellurium-containing compound layer 6 as a switching layer (switching element) can be performed by a compound containing a chalcogenide element, such as tellurium (Te). In particular, a compound containing tellurium as a chalcogenide element has the advantage that the above-described voltage threshold (Vth) is low. In the variable resistance element 1 of this present embodiment, a tellurium-containing and oxygen-containing compound (hereinafter referred to as the first compound) includes tellurium (Te), oxygen (O), and at least one other element (hereinafter referred to as an M1 element). The M1 element is selected from a group comprising tin (Sn), copper (Cu) and bismuth (Bi). The first compound is used in the tellurium-containing compound layer 6 in this example. Another tellurium-containing and oxygen-containing compound (hereinafter referred to as the second compound) additionally contains at least one other element (hereinafter referred to as an M2 element). The M2 element is selected from a group comprising indium (In), gallium (Ga) and zinc (Zn). The second compound may also be used in the tellurium-containing compound layer 6.

The tellurium-containing compound layer 6 comprising such a tellurium-containing and oxygen-containing compounds can have the property (switching property) of changing between the high-resistance state and the low-resistance state based on the voltage threshold (Vth). The switching property derives from an electrical conduction mechanism through a localized state in the band gap due to an amorphous structure. It is therefore preferred in this context that the tellurium-containing compound layer 6 has an amorphous structure. From the viewpoint of obtaining an amorphous structure, the tellurium-containing and oxygen-containing compound may also contain a small amount of nitrogen (N).

With regard to the fact that the tellurium-containing compound layer 6 comprising the tellurium-containing and oxygen-containing compound has the property of changing between the high-resistance state and the low-resistance state based on the voltage threshold (Vth) (switching property), it can be determined from the band gaps (Eg) of compounds between the elements constituting the tellurium-containing and oxygen-containing compound. Oxides and tellurium compounds of the M1 elements and the M2 elements each have the properties of a semiconductor. Table 1 shows the band gaps (Eg) of oxides of the various M1 elements and the various M2 elements (which may each be referred to as metal elements). Table 2 shows the band gaps (Eg) of tellurium compounds of the M1 elements and the M2 elements.

TABLE 1

| Metal | Oxide (Eg) |
| --- | --- |
| Cu | $Cu_2O$ (2.17 eV) |
| Sn | $SnO_2$ (~3.6 eV) |
|  | SnO (2.5-3 eV) |
| Bi | $Bi_2O_3$ (2-3.96 eV) |
| Zn | ZnO (3.3 eV) |
| Ga | $Ga_2O_3$ (4.8 eV) |
| In | $In_2O_3$ (2.6-2.9 eV) |
| Si (reference) | $SiO_2$ (9.3 eV) |

TABLE 2

| Metal | Te compound (Eg) |
| --- | --- |
| Cu | $Cu_2Te$ (0.67-1.1 eV) |
| Sn | SnTe (0.2 eV) |
| Bi | $Bi_2Te_3$ (0.13 eV) |
| Zn | ZnTe (2.25 eV) |
| Ga | $Ga_2Te_3$ (1.08-1.2 V) |
| In | $In_2Te_3$ (1.03-1.18 eV) |
| Si (reference) | $Si_2Te_3$ (1.8 V) |

As shown in Tables 1 and 2, any oxide or tellurium compound containing one of the metal elements M1 and M2 has an appropriate band gap (Eg). More specifically, the band gaps of the different metal oxides (M1-O and M2-O) are each on the order of more than 1 eV and less than 5 eV, while the band gaps of the different metal-tellurium compounds (M1-Te and M2-Te) are each on the order of more than 0.1 eV and less than 3 eV. For any M1 element or M2 element, the band gap (Eg) of the tellurium compound is smaller than the band gap (Eg) of the oxide. Therefore, the first and second compounds have an electron structure in which a localized state derived from a metal-tellurium compound is included in a large band gap derived from a metal oxide. It can be determined from the above that the first and second compounds have the above-described switching property.

Further, the band gap (Eg) of a tellurium compound with an M1 element is smaller than that of a tellurium compound with an M2 element. Therefore, the tellurium-containing compound layer 6 composed of the first compound containing an M1 element(s), tellurium and oxygen can decrease the voltage threshold (Vth). This makes it possible to enhance the operating characteristics and the practicality of the variable resistance element 1. Furthermore, by adding an M2 element to the first compound, the stability of the tellurium- and oxygen-containing compound can be enhanced. The band gap data of Table 1 and Table 2 verifies that an oxide and a tellurium compound of an M2 element will not impair the switching property. Thus, the tellurium-containing compound layer 6 composed of the second compound can decrease the voltage threshold (Vth) and enhance the stability without impairing the switching property.

The first compound and the second compound, constituting the tellurium-containing compound layer 6, preferably have an amorphous structure. From the viewpoint of obtaining the above-described switching property, the tellurium-containing compound layer 6 preferably is an amorphous semiconductor having a larger extent of localized state in the band gap. To make the compound amorphous, an effective method is to mix cations having different valences and different atomic radii. It is known that tin (Sn) atoms can be divalent or tetravalent, copper (Cu) atoms can be monovalent or divalent, and bismuth (Bi) atoms can be trivalent or pentavalent. By mixing such an M1 element with tellurium, and making at least part of the mixture an oxide, the tellurium-containing and oxygen-containing compound containing an M1 element is made amorphous. The same holds true for the tellurium-containing and oxygen-containing compound containing an M1 element and an M2 element. As described above, the tellurium-containing and oxygen-containing compounds may also contain a small amount of nitrogen (N).

Nitrides, such as a Si—Te—N compound and a B—Te—N compound, have been studied as tellurium-containing compounds that function as a switching layer. While such tellurium-containing compounds have the advantage that the voltage threshold (Vth) is low, they have the drawback that tellurium is likely to undergo phase separation during operation of the variable resistance element. If tellurium undergoes phase separation during operation of the variable resistance element, the functioning of the switching layer will deteriorate, resulting in an inability to control electric current supply to the variable resistance element. This may significantly reduce the durability of the variable resistance element and, what is worse, may lead to an inoperability of the switching layer.

This suggests a focus on tellurium oxides rather than tellurium nitrides. It is therefore conceivable to use an oxide, such as a Si—Te—O compound or a B—Te—O compound, instead of a nitride such as a Si—Te—N compound or a B—Te—N compound. Thus, it is conceivable that stabilization of tellurium and thus prevention of phase separation of tellurium will be achieved by allowing tellurium to be present as an oxide in a tellurium-containing compound. However, a silicon oxide ($SiO_x$) is generally too stable as compared to a tellurium oxide ($TeO_x$); therefore, there is a fear of a phase separation into Te and a Si oxide. The same holds true for a boron oxide ($BO_x$) in comparison with a tellurium oxide ($TeO_x$).

In view of the above, it is preferred that in the tellurium-containing compound layer 6 that is used as a switching layer, the differences between the bond energies of the bonds (X—Te, X—O and Te—O) between the constituent elements, namely the metal element (where X is a M1 element or a M2 element), tellurium (Te) and oxygen (O), be small. Thus, it is preferred that the standard deviation of the bond energies of the bonds X—Te, X—O and Te—O be small. A small standard deviation of the bond energies of the bonds X—Te, X—O and Te—O indicates that these compounds are present individually and stably. Thus, phase separation of tellurium during operation of the variable resistance element 1 can be prevented. This makes it possible to enhance the cycle characteristics of the tellurium-containing compound layer 6 as a switching layer, thereby enhancing the durability of the layer.

Figure 3:
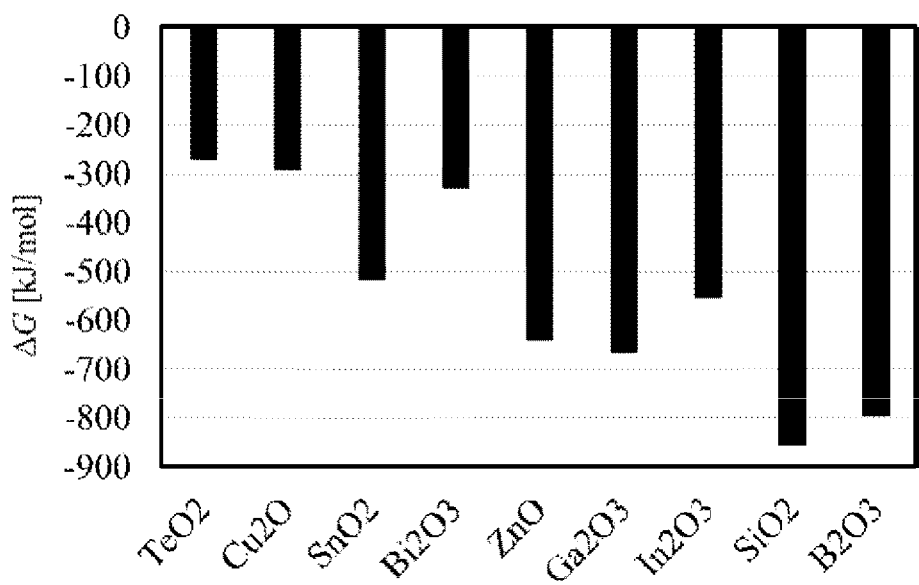
FIG. 3 is a diagram showing the standard Gibbs energies of formation of compounds of a metal with oxygen in a tellurium-containing compound layer of a variable resistance element according to an embodiment.
Figure 4:
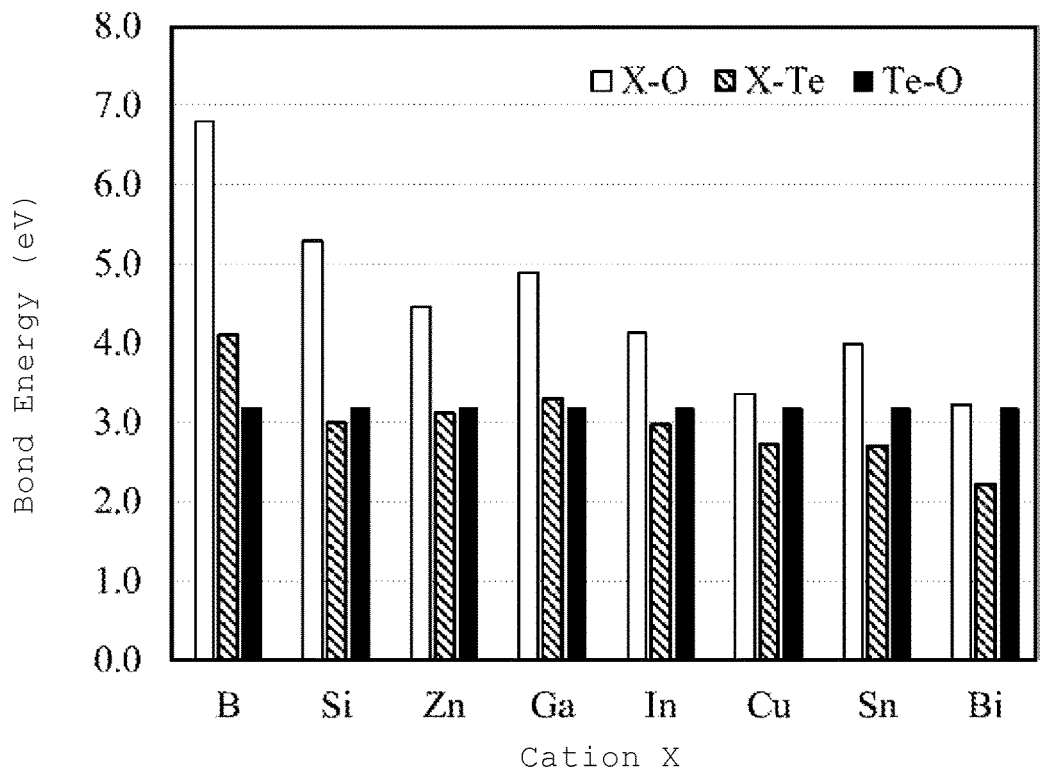
FIG. 4 is a diagram showing metal-oxygen, metal-tellurium and tellurium-oxygen bond energies in the tellurium-containing compound layer of a variable resistance element according to an embodiment.

FIG. 3 shows the standard Gibbs energies of formation (per mol of oxygen molecule) of the oxides of the various metal elements. FIG. 4 and Table 3 show the bond energies of X—Te, X—O and Te—O, and FIG. 5 and Table 3 show the standard deviation σ of the bond energies of X—Te, X—O and Te—O.

TABLE 3

| Cation X | Bond energy [eV] | | | |
| --- | --- | --- | --- | --- |
| | X-0 | X—Te | Te—O | Standard deviation σ |
| Cu | 3.4 | 2.7 | 3.2 | 0.27 |
| Sn | 4.0 | 2.7 | 3.2 | 0.54 |
| Bi | 3.2 | 2.2 | 3.2 | 0.47 |
| Zn | 4.5 | 3.1 | 3.2 | 0.78 |
| Ga | 4.9 | 3.3 | 3.2 | 0.78 |
| In | 4.1 | 3.0 | 3.2 | 0.51 |
| Si(reference) | 5.3 | 3.0 | 3.2 | 1.04 |
| B(reference) | 6.8 | 4.1 | 3.2 | 1.53 |

In the standard Gibbs energies of formation (ΔG) shown in FIG. 3, a lower ΔG value (higher absolute value) indicates higher stability of the compound. FIG. 3 also shows the standard Gibbs energies of formation of the silicon oxide and the boron oxide for reference. As can be seen in FIG. 3, the standard Gibbs energies of formation of the Si oxide and the B oxide are lower than those of the M1 oxides and the M2 oxides, indicating that the stabilities of the Si oxide and the B oxide are higher than those of the M1 oxides and the M2 oxides.

Figure 5:
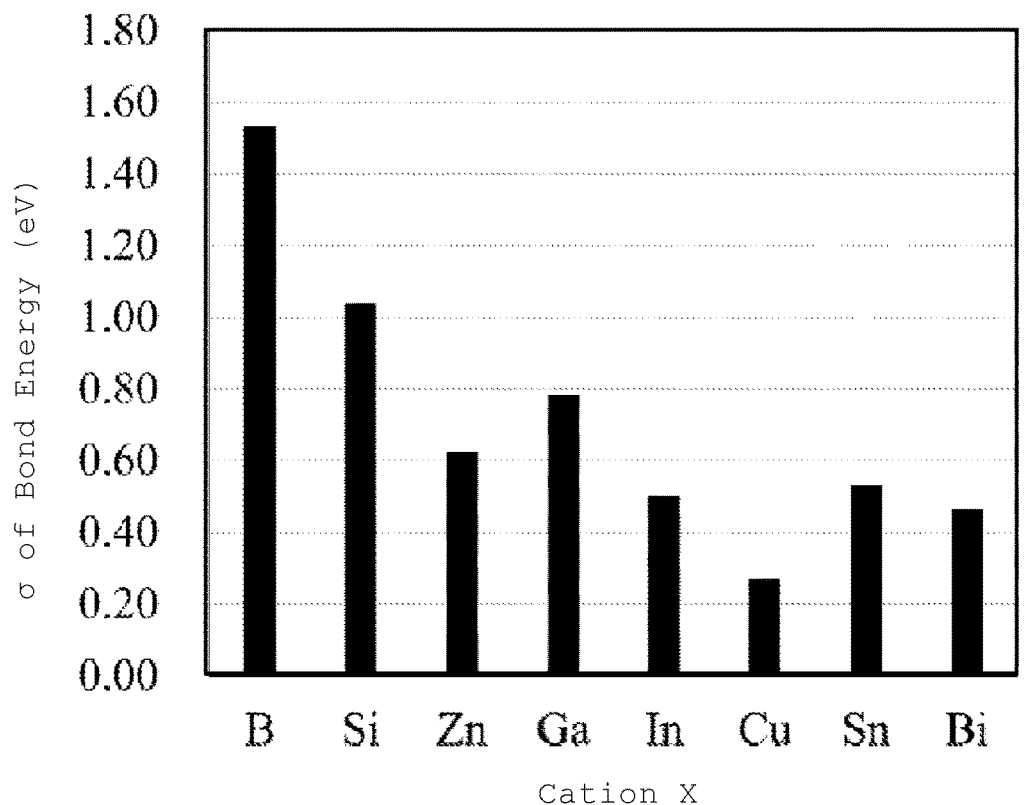
FIG. 5 is a diagram showing the standard deviation of the metal-oxygen, metal-tellurium and tellurium-oxygen bond energies in the tellurium-containing compound layer of a variable resistance element according to an embodiment.

FIGS. 4, 5 and Table 3 also show the bond energies and their standard deviation σ of Si(B)—O, Si(B)—Te and Te—O for reference. As can be seen in FIGS. 4, 5 and Table 3, the differences between the bond energies of M1-Te, M1-O and Te—O are small, and the standard deviation σ of the bond energies is small. Also, in the case of M2-Te, M2-O and Te—O, the differences between the bond energies of M2-Te, M2-O and Te—O are small, and the standard deviation σ of the bond energies is small. The data on the bond energies coincides with the data on the standard Gibbs energies of formation shown in FIG. 3.

As will be appreciated from the above, the tellurium-containing compound layer 6 composed of the first compound or the second compound has the property of changing between the high-resistance state and the low-resistance state based on the voltage threshold (Vth) (a switching property), and functions as a switching layer for the variable resistance element 1. Further, the differences between the bond energies of compounds between the elements constituting the tellurium-containing compound layer 6 are small, and thus the standard deviation σ of the bond energies is small. Therefore, phase separation of tellurium during operation of the variable resistance element 1 can be prevented. This makes it possible to enhance the function and the cycle characteristics of the tellurium-containing compound layer 6 when it is used as a switching layer, and thus to enhance the durability of the variable resistance element 1.

In the case where the first compound is used for the tellurium-containing compound layer 6 being used as a switching layer in the variable resistance element 1 of this embodiment, the first compound preferably has a composition represented by the general formula: $M1_xTe_yO_w$, Formula (1) where x, y and w are each a number more than 0 and less than 1, indicating an atomic ratio, and x+y+w=1.

More preferably, the first compound has a composition represented by the general formula: $M1_xTe_yO_w$, Formula (2) where x is a number indicating an atomic ratio and satisfying 0<x≤0.7, y is a number indicating an atomic ratio and satisfying 0.1≤y≤0.9, w is a number indicating an atomic ratio and satisfying 0<w≤0.6, and x+y+w=1.

When x, y and w in the formula (2) fall within the above ranges, the function of the switching layer can be enhanced and the effect of preventing phase separation of some components can be increased. In general, x is preferably not less than 0.1.

In the case where the second compound is used for the tellurium-containing compound layer 6 being used as a switching layer in the variable resistance element 1 of this embodiment, the second compound preferably has a composition represented by the general formula: $M1_xM2_zTe_yO_w$ Formula (3) where x, y, z and w are each a number more than 0 and less than 1, indicating an atomic ratio, and x+y+Z+w=1.

More preferably, the second compound has a composition represented by the general formula: $M1_xM2_zTe_yO_w$, Formula (4) where x is a number indicating an atomic ratio and satisfying 0<x≤0.7, y is a number indicating an atomic ratio and satisfying 0.1≤y≤0.9, z is a number indicating an atomic ratio and satisfying 0.1≤z≤0.9, w is a number indicating an atomic ratio and satisfying 0<w≤0.6, and x+y+z+w=1.

When x, y and w in the formula (4) fall within the above ranges, the function of the switching layer can be enhanced and the effect of preventing phase separation of some components can be increased. In general, x is preferably not less than 0.1.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A variable resistance element, comprising:
   a first electrode;
   a second electrode; and
   a magnetoresistive random access memory (MRAM) layer and a tellurium-containing compound layer between the first electrode and the second electrode, wherein
   the tellurium-containing compound layer comprises tellurium, oxygen, copper, nitrogen, at least one element selected from a group consisting of indium, gallium, and zinc, and a compound having a composition represented by a general formula $M1_x M2_z Te_y O_w$ where x, y, z, and w are each a number more than 0 and less than 1 indicating an atomic ratio, M1 is copper, M2 is at least one element selected from the group consisting of indium, gallium, and zinc, and the relationship x+y+z+w=1 is satisfied.

2. The variable resistance element according to claim 1, wherein the tellurium-containing compound layer has an amorphous structure.

3. The variable resistance element according to claim 1, wherein
   x satisfies the relationship $0<x\leq0.7$, y satisfies the relationship $0.1\leq y\leq0.9$, z satisfies the relationship $0.1\leq z\leq0.9$, and w satisfies the relationship $0<w\leq0.6$.

4. The variable resistance element according to claim 3, wherein the tellurium-containing compound layer has an amorphous structure.

5. The variable resistance element according to claim 1, wherein the first and second electrodes are metal.

6. A memory storage device, comprising:
   a memory cell structure connected between a word line and a bit line, the memory cell structure comprising:
   a magnetoresistive random access memory (MRAM) layer and a tellurium-containing compound layer, wherein
   the tellurium-containing compound layer comprises tellurium, oxygen, copper, nitrogen, at least one element selected from a group consisting of indium, gallium, and zinc, and a compound having a composition represented by a general formula $M1_x M2_z Te_1 O_w$ where x, y, z, and w are each a number more than 0 and less than 1 indicating an atomic ratio, M1 is copper, M2 is the at least one element selected from the group consisting of indium, gallium, and zinc, and the relationship x+y+z+w=1 is satisfied.

7. The memory storage device according to claim 6, wherein the tellurium-containing compound layer has an amorphous structure.

8. The memory storage device according to claim 6, wherein x satisfies the relationship $0<x\leq0.7$, y satisfies the relationship $0.1\leq y\leq0.9$, z satisfies the relationship $0.1\leq z\leq0.9$, and w satisfies the relationship $0<w\leq0.6$.

9. The memory storage device according to claim 8, wherein the tellurium-containing compound layer has an amorphous structure.

10. A variable resistance element, comprising:
    a first electrode;
    a second electrode; and
    a stacked structure between the first and second electrodes, the stacked structure including:
    a magnetoresistive random access memory (MRAM) layer, and
    a tellurium-containing compound layer comprising tellurium, oxygen, copper, nitrogen, and a compound having a composition represented by a general formula $M1_x M2_z Te_1 O_w$ where x, y, z, and w are each a number more than 0 and less than 1 indicating an atomic ratio, M1 is copper, M2 is at least one element selected from a group consisting of indium, gallium, and zinc, and the relationship x+y+z+w=1 is satisfied.

11. The variable resistance element according to claim 10, wherein the tellurium-containing compound layer has an amorphous structure.

12. The variable resistance element according to claim 10, wherein x satisfies the relationship $0<x\leq0.7$, y satisfies the relationship $0.1\leq y\leq0.9$, z satisfies the relationship $0.1\leq z\leq0.9$, and w satisfies the relationship $0<w\leq0.6$.

13. The variable resistance element according to claim 12, wherein the tellurium-containing compound layer has an amorphous structure.

14. The variable resistance element according to claim 10, wherein the first and second electrodes are metal.

* * * * *

UNITED STATES PATENT AND TRADEMARK OFFICE
CERTIFICATE OF CORRECTION

| | |
|---|---|
| PATENT NO. | : 11,424,290 B2 |
| APPLICATION NO. | : 16/803933 |
| DATED | : August 23, 2022 |
| INVENTOR(S) | : Hiroki Kawai et al. |

It is certified that error appears in the above-identified patent and that said Letters Patent is hereby corrected as shown below:

In the Claims

In Column 7, Claim 6, Line 42, please delete "Te1" and replace with "Tey".

In Column 8, Claim 10, Line 26, please delete "Te1" and replace with "Tey".

Signed and Sealed this
Twenty-fourth Day of January, 2023

Katherine Kelly Vidal
*Director of the United States Patent and Trademark Office*